US010228395B2

(12) United States Patent
Hebiguchi

(10) Patent No.: US 10,228,395 B2
(45) Date of Patent: Mar. 12, 2019

(54) NON-CONTACT VOLTAGE MEASUREMENT DEVICE

(71) Applicant: Alps Electric Co., Ltd., Ota-ku, Tokyo (JP)

(72) Inventor: Hiroyuki Hebiguchi, Miyagi-ken (JP)

(73) Assignee: Alps Electric Co., Ltd., Tokyo (JP)

(*) Notice: Subject to any disclaimer, the term of this patent is extended or adjusted under 35 U.S.C. 154(b) by 42 days.

(21) Appl. No.: 15/719,161

(22) Filed: Sep. 28, 2017

(65) Prior Publication Data

US 2018/0017598 A1 Jan. 18, 2018

Related U.S. Application Data

(63) Continuation of application No. PCT/JP2016/062639, filed on Apr. 21, 2016.

(30) Foreign Application Priority Data

Apr. 28, 2015 (JP) ................................. 2015-092095

(51) Int. Cl.
*G01R 19/00* (2006.01)
*G01R 15/16* (2006.01)
(Continued)

(52) U.S. Cl.
CPC .............. *G01R 15/16* (2013.01); *G01R 19/00* (2013.01); *G01R 19/0084* (2013.01);
(Continued)

(58) Field of Classification Search
CPC ............ G01R 19/0092; G01R 19/0084; G01R 19/00; G01R 19/165; G01R 21/00; G01R 31/40
(Continued)

(56) References Cited

U.S. PATENT DOCUMENTS

2005/0077909 A1* 4/2005 Lalla ..................... G01D 5/24
324/658
2016/0202104 A1* 7/2016 Shibata ................ G01F 23/265
73/304 C
2016/0313862 A1* 10/2016 Mamba ................... G06F 3/044

FOREIGN PATENT DOCUMENTS

JP 10-206468 8/1998

OTHER PUBLICATIONS

International Search Report from International Application No. PCT/JP2016/062639 dated Jul. 12, 2016.

* cited by examiner

*Primary Examiner* — Giovanni Astacio-Oquendo
*Assistant Examiner* — Raul J Rios Russo
(74) *Attorney, Agent, or Firm* — Beyer Law Group LLP

(57) ABSTRACT

In a non-contact voltage measurement device that can precisely measure an alternating-current voltage with a simple structure, a first capacitor and second capacitor, having mutually correlated capacitances, are respectively formed between a first electrode and a conductor and between a second electrode and the conductor. An alternating-current signal is given between the first electrode and a first reference potential. When a switch is off, a first charge detecting signal matching charges accumulated in the second capacitor by the alternating-current signal is created with the second electrode kept at the first reference potential. When the switch is on, a second charge detecting signal matching charges accumulated in the second capacitor by the alternating-current voltage is created with the second electrode kept at a second reference potential. A measurement of the alternating-current voltage is calculated in a calculating unit, according to the first charge detecting signal and second charge detecting signal.

14 Claims, 4 Drawing Sheets

(51) Int. Cl.
 *G01R 19/165* (2006.01)
 *G01R 21/00* (2006.01)
(52) U.S. Cl.
 CPC ........ *G01R 19/0092* (2013.01); *G01R 19/165* (2013.01); *G01R 21/00* (2013.01)
(58) Field of Classification Search
 USPC .......................................... 324/76.11–76.83
 See application file for complete search history.

NON-CONTACT VOLTAGE MEASUREMENT DEVICE

CLAIM OF PRIORITY

This application is a Continuation of International Application No. PCT/JP2016/062639 filed on Apr. 21, 2016, which claims benefit of Japanese Patent Application No. 2015-092095 filed on Apr. 28, 2015. The entire contents of each application noted above are hereby incorporated by reference.

BACKGROUND OF THE INVENTION

1. Field of the Invention

The present invention relates to a non-contact voltage measurement device that measures an alternating-current voltage applied to a conductor, without continuity to the conductor.

2. Description of the Related Art

A known non-contact voltage measurement device can measure an alternating-current voltage in an electric wire connected to a commercial electric power source or the like from the outside of an insulating coating, without continuity to the electric wire. In Japanese Unexamined Patent Application Publication No. 10-206468 below, for example, a device is described that holds a conductor (electric wire) coated with an insulator by using a detection probe from the outside and measures an alternating-current voltage. The detection probe has a detection electrode that encloses the outer circumference of the insulating coating of the conductor. An impedance (capacitance) between the detection electrode and the electric wire is measured by giving the detection electrode an oscillation signal with a frequency higher than the frequency of the alternating-current voltage to be measured. A measurement of the alternating-current voltage is obtained according to a measured value of the impedance and a measured value of a current flowing from the detection electrode due to the alternating-current voltage applied to the conductor.

SUMMARY OF THE INVENTION

With the device described in Japanese Unexamined Patent Application Publication No. 10-206468, when the impedance (capacitance C1) between the detection electrode and the electric wire is measured, a current component Is that flows into the detection electrode due to an oscillation signal is detected. In the detection electrode, however, a current component Ix is present that flows from the detection electrode due to the alternating-current voltage applied to the conductor, besides the current component Is that follows due to an oscillation signal. Therefore, this device needs a filter (band-pass filter or low-pass filter) used to discriminate between the current components Is and Ix.

In addition, the detection probe has a shield electrode that encloses the further outer circumference of the detection electrode. This shield electrode is grounded, so a stray capacitance C0 is present between the detection electrode and the shield electrode. With the device described in Japanese Unexamined Patent Application Publication No. 10-206468, therefore, the stray capacitance C0 is first measured in a state in which the detection probe is removed from the conductor. Then, a combined capacitance Cc (=C0+C1) of the capacitance C1 and stray capacitance C0 is measured in a state in which the detection probe is attached to the conductor. A measurement of the capacitance C1 is obtained by subtracting a measurement of stray capacitance C0 from a measurement of the combined capacitance Cc. Therefore, to obtain a measurement of the alternating-current voltage, measurement processing must be performed in both the state in which the detection probe is removed from the conductor and the state in which the detection probe is attached to the conductor, so a measurement procedure become complex. Another problem is that, if the stray capacitance C0 changes after the detection probe has been attached to the conductor (if, for example, the shield electrode deforms or a dielectric constant changes due to moisture absorption), the detection probe must be removed from the conductor and then the stray capacitance C0 must be measured again.

Furthermore, there are changes in the shapes of the detection electrode and shield electrode between the state in which the detection probe is removed from the conductor and the state in which the detection probe is attached to the conductor. Due to this, the state of the electric wire changes at an end of the electrode. Therefore, error occurs in measurement of the stray capacitance C0. This is problematic in this error lowers precision in measurement of the alternating-current voltage.

The present invention addresses the above situation by providing a non-contact voltage measurement device that can precisely measure an alternating-current voltage with a simple structure.

The present invention relates to a non-contact voltage measurement device that measures an alternating-current voltage applied to a conductor, without continuity to the conductor.

A non-contact voltage measurement device according to a first aspect of the present invention includes: a first electrode that forms a first capacitor between the first electrode and the conductor; a second electrode that forms a second capacitor between the second electrode and the conductor, the second capacitor having a capacitance correlating with the capacitance of the first capacitor; an alternating-current signal source that gives an alternating-current signal between the first electrode and a first reference potential; a charge detecting unit that maintains the second electrode at a certain potential with respect to the first reference potential, and creates a charge detecting signal matching charges accumulated in the second capacitor; a switch disposed between the first reference potential and a second reference potential used as a reference in measurement of the alternating-current voltage; and a calculating unit that calculates a measurement of the alternating-current voltage according to the charge detecting signal created with the switch turned off and to the charge detecting signal created with the switch turned on.

With the above structure, the first capacitor and the second capacitor that have a correlation with each other are respectively formed between the first electrode and the conductor and between the second electrode and the conductor, and the alternating-current signal is given between the first electrode and the first reference potential. With the switch turned off, the second electrode is maintained at a certain potential with respect to the first reference potential and the alternating-current signal is given between the first electrode and the first reference potential, so charges are accumulated in the second capacitor by the alternating-current signal. In this case, in the detecting unit, a charge detecting signal matching charges accumulated in the second capacitor by the alternating-current signal is created. With the switch turned on, the second electrode is maintained at a certain potential with respect to the second reference potential, so charges are accumulated in the second capacitor by the alternating-current voltage applied between the second reference potential and the conductor. In this case, in the detecting unit, a charge detecting signal matching charges accumulated in the second capacitor by the alternating-current voltage is created. In the calculating unit, a measurement of the alternating-current voltage is calculated according to the charge detecting signal created with the switch turned off and to the charge detecting signal created with the switch turned on.

Accordingly, unlike the conventional device, a measurement of the alternating-current voltage applied to the conductor can be obtained without having to provide a filter used to discriminate between a component having the frequency of the alternating-current voltage and a component having the frequency of the alternating-current signal. In addition, unlike the conventional device, there is no need to remove the electrodes from the conductor before measuring stray capacitances, so the measurement procedure can be simplified and measurement precision is improved.

Preferably, the alternating-current signal source may generate the alternating-current signal having a frequency higher than the frequency of the alternating-current voltage.

Accordingly, when the switch is off, charges accumulated in the second capacitor by the alternating-current signal are increased with respect to charges accumulated in the second capacitor by the alternating-current voltage, so error of the charge detecting signal, the error being caused by the charges accumulated in the second capacitor, is reduced.

Preferably, the conductor may have a conductor-side flat part facing the first electrode and the second electrode. The first electrode may have an electrode-side flat part parallel to the conductor-side flat part, and the second electrode may have an electrode-side flat part parallel to the conductor-side flat part, the electrode-side flat parts being equally distant from the conductor-side flat part.

Accordingly, since the ratio of capacitances between the first capacitor and the second capacitor becomes nearly equal to the ratio of the areas of the electrode-side flat parts of the first electrode and the second electrode, precision with which the ratio of capacitances is set becomes high.

Preferably, the electrode-side flat parts of the first electrode and the second electrode may be congruent to each other, and the capacitances of the first capacitor and the second capacitor may be equal.

Accordingly, since the ratio of the areas of the electrode-side flat parts of the first electrode and the second electrode is precisely set, precision with which the ratio of the capacitances of the first capacitor and the second capacitor is set becomes further high.

Preferably, the first electrode and the second electrode may be placed close to each other.

Accordingly, the shapes and sizes of the first electrode and the second electrode are less likely to be affected by variations in manufacturing, so precision in the ratio of the areas of the electrode-side flat parts is improved.

Preferably, the non-contact voltage measurement device according to the first aspect may have a guard ring that encloses at least one of the first electrode and the second electrode.

Accordingly, a drop in measurement precision due to external noise is suppressed.

A non-contact voltage measurement device according to a second aspect of the present invention includes a first electrode that forms a first capacitor between the first electrode and the conductor, a second electrode that forms a second capacitor between the second electrode and the conductor, the second capacitor having a capacitance correlating with the capacitance of the first capacitor, a third electrode that forms a third capacitor between the third electrode and the conductor, the third capacitor having the capacitance correlating with the capacitance of the first capacitor, an alternating-current signal source that gives an alternating-current signal between the first electrode and a first reference potential, a first charge detecting unit that maintains the second electrode at a certain potential with respect to the first reference potential, and creates a first charge detecting signal matching charges accumulated in the second capacitor, a second charge detecting unit that maintains the third electrode at a certain potential with respect to a second reference potential used as a reference in measurement of the alternating-current voltage, and creates a second charge detecting signal matching charges accumulated in the third capacitor, and a calculating unit that calculates a measurement of the alternating-current voltage according to the first charge detecting signal and the second charge detecting signal.

With the above structure, the first capacitor, the second capacitor, and the third capacitor that have a correlation with one another are respectively formed between the first electrode and the conductor, between the second electrode and the conductor, and between the third electrode and the conductor. Since the second electrode is maintained at a certain potential with respect to the first reference potential and the alternating-current signal is given between the first electrode and the first reference potential, charges are accumulated in the second capacitor by the alternating-current signal. In the first charge detecting unit, the first charge detecting signal matching charges accumulated in the second capacitor by the alternating-current signal is created. In addition, since the second electrode is maintained at a certain potential with respect to the second reference potential, charges are accumulated in the second capacitor by the alternating-current voltage applied between the second reference potential and the conductor. In the second charge detecting unit, the second charge detecting signal matching charges accumulated in the third capacitor by the alternating-current voltage is created. In the calculating unit, a measurement of the alternating-current voltage is calculated according to the first charge detecting signal and the second charge detecting signal.

Accordingly, unlike the conventional device, a measurement of the alternating-current voltage applied to the conductor can be obtained without having to provide a filter used to discriminate between a component having the frequency of the alternating-current voltage and a component having the frequency of the alternating-current signal. In addition, unlike the conventional device, there is no need to remove the electrodes from the conductor before measuring stray capacitances, so the measurement procedure can be simplified and measurement precision is improved.

Preferably, the alternating-current signal source may generate the alternating-current signal having a frequency higher than the frequency of the alternating-current voltage.

Accordingly, charges accumulated in the second capacitor by the alternating-current signal are increased with respect to charges accumulated in the second capacitor by the alternating-current voltage, so error of the first charge detecting signal, the error being caused by the charges accumulated in the second capacitor, is reduced.

Preferably, the conductor may have a conductor-side flat part facing the first electrode, the second electrode, and the third electrode. The first electrode may have an electrode-side flat part parallel to the conductor-side flat part, the second electrode may have an electrode-side flat part parallel to the conductor-side flat part, and the third electrode may have an electrode-side flat part parallel to the conductor-side flat part, the electrode-side flat parts being equally distant from the conductor-side flat part.

Accordingly, since the ratio of the capacitances of the first capacitor, the second capacitor, and the third capacitor becomes nearly equal to the ratio of the areas of the electrode-side flat parts of the first electrode, the second electrode, and the third electrode, precision with which the ratio of capacitance is set becomes high.

Preferably, the electrode-side flat parts of the first electrode, the second electrode, and the third electrode may be congruent to one another, and the capacitances of the first capacitor, the second capacitor, and the third capacitor may be equal.

Accordingly, since the ratio of the areas of the electrode-side flat parts of the first electrode, the second electrode, and the third electrode is precisely set, precision with which the ratio of the capacitances of the first capacitor, the second capacitor, and the third capacitor becomes further high.

Preferably, the first electrode and the second electrode may be placed close to each other.

Accordingly, the shapes and sizes of the first electrode and the second electrode are less likely to be affected by variations in manufacturing, so precision in the ratio of the areas of the electrode-side flat parts is improved.

Preferably, the non-contact voltage measurement device according to the second aspect may have a first guard ring that encloses at least one of the first electrode and the second electrode and/or a second guard ring that encloses the third electrode.

Accordingly, a drop in measurement precision due to external noise is suppressed.

A non-contact voltage measurement device according to a third aspect of the present invention includes a plurality of electrodes that form capacitors between the plurality of electrodes and the conductor, the capacitors having mutually correlated capacitances, an alternating-current signal source that gives an alternating-current signal between a first reference potential and one of two of the plurality of electrodes, a detecting unit that creates a first charge detecting signal matching charges accumulated in the capacitor of the other of the two of the plurality of electrodes by the alternating-current signal in a state in which the other electrode is maintained at a certain potential with respect to the first reference potential and also creates a second charge detecting signal matching charges accumulated in the capacitor of one of the plurality of electrodes by the alternating-current voltage in a state in which the one of the plurality of electrodes is maintained at a certain potential with respect to a second reference potential used as a reference in measurement of the alternating-current voltage, and a calculating unit that calculates a measurement of the alternating-current voltage according to the first charge detecting signal and the second charge detecting signal.

With the above structure, the plurality of mutually correlated capacitors are formed between the plurality of electrodes and the conductor. The alternating-current signal is given between the first reference potential and one of two of the plurality of electrodes, and the other of the two of the plurality of electrodes is maintained at a certain potential with respect to the first reference potential. Therefore, charges are accumulated in the capacitor of the other electrode by the alternating-current signal. In the detecting unit, the first detecting signal matching charges accumulated in the capacitor of the other electrode by the alternating-current signal is created. In addition, since the one electrode is maintained at a certain potential with respect to the second reference potential, charges are accumulated in the capacitor of the one electrode by the alternating-current voltage applied between the second reference potential and the conductor. In the detecting unit, the second detecting signal matching charges accumulated in the capacitor of the one electrode by the alternating-current voltage. In the calculating unit, a measurement of the alternating-current voltage is calculated according to the first charge detecting signal and the second charge detecting signal is created.

Accordingly, unlike the conventional device, a measurement of the alternating-current voltage applied to the conductor can be obtained without having to provide a filter used to discriminate between a component having the frequency of the alternating-current voltage and a component having the frequency of the alternating-current signal. In addition, unlike the conventional device, there is no need to remove the electrodes from the conductor before measuring stray capacitances, so the measurement procedure can be simplified and measurement precision is improved.

According to the present invention, a non-contact voltage measurement device can be provided that can precisely measure an alternating-current voltage with a simple structure.

BRIEF DESCRIPTION OF THE DRAWINGS

FIG. 5A illustrates a guard ring provided around the electrodes illustrated in FIG. 2, and FIG. 5B illustrates guard rings provided around the electrodes illustrated in FIG. 4.

DESCRIPTION OF THE PREFERRED EMBODIMENTS

First Embodiment

Figure 1:
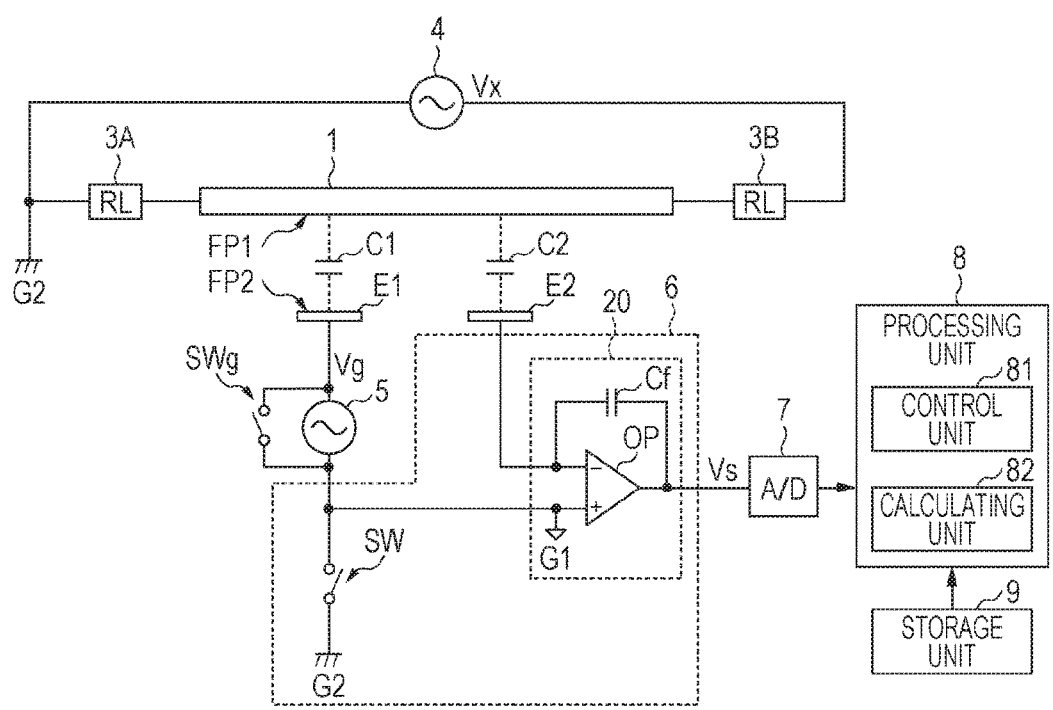
FIG. 1 illustrates an example of the structure of a non-contact voltage measurement device according to a first embodiment.
Figure 2:
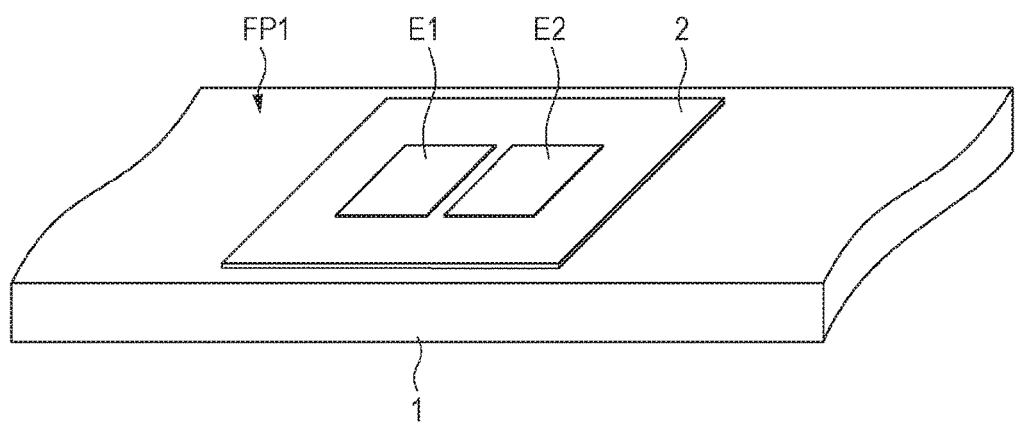
FIG. 2 illustrates examples of electrodes in the non-contact voltage measurement device illustrated in FIG. 1.

A non-contact voltage measurement device according to a first embodiment of the present invention will be described below with reference to the drawings. FIG. 1 illustrates an example of the structure of the non-contact voltage measurement device according to the first embodiment. FIG. 2 illustrates examples of electrodes E1 and E2 used to measure an alternating-current voltage in the in the non-contact voltage measurement device illustrated in FIG. 1.

The non-contact voltage measurement device according to this embodiment measures an alternating-current voltage Vx applied to a conductor 1, without continuity to the conductor 1. Here, "without continuity" means that a target to be measured and the non-contact voltage measurement device are insulated in terms of a direct current. "Without continuity" is also true for a case in which an insulator is present between a target to be measured and the non-contact voltage measurement device and a case in which a target to be measured and the non-contact voltage measurement device are separated with a space intervening therebetween. This non-contact voltage measurement device has a first electrode E1, a second electrode E2, an alternating-current signal source 5, a detecting unit 6, an AD converting unit 7, a processing unit 8, a storage unit 9, and a switch SWg, as illustrated in, for example, FIG. 1.

The non-contact voltage measurement device illustrated in FIG. 1 measures an alternating-current voltage by using electrostatic coupling caused between the two electrodes E1 and E2 placed in the vicinity of the conductor 1. The conductor 1 is, for example, a bus bar provided in a power distribution panel connected to a power supply line or the like that supplies electric power of a commercial electric power system 4. The conductor 1 preferably has a flat part FP1 (conductor-side flat part) facing the electrodes E1 and E2. In the example in FIG. 2, the conductor 1 has an elongated plate-like shape. If the conductor 1 has the flat part FP1, however, the conductor 1 may have any other shape.

The first electrode E1 forms a first capacitor C1 between the first electrode E1 and the conductor 1, and the second electrode E2 forms a second capacitor C2 between the second electrode E2 and the conductor 1. In the example in FIG. 2, the first electrode E1 and second electrode E2 are conductive patterns formed on a circuit board 2 (printed circuit board, flexible printed circuit board, or the like) formed from an insulating body. The first electrode E1 and second electrode E2 each preferably have a flat part FP2 (electrode-side flat part) parallel to the conductor-side flat part FP1. Since the electrode-side flat parts FP2 of the first electrode E1 and second electrode E2 are formed on the circuit board 2 shared by them, the electrode-side flat parts FP2 are preferably equally distant from the conductor-side flat part FP1.

In the example in FIG. 2, the electrode-side flat parts FP2 of the first electrode E1 and second electrode E2 have a rectangular shape and are preferably congruent to each other. The first capacitor C1 and second capacitor C2 are each a parallel plate type of capacitor. There is a match between the area of the opposing conductive bodies of the first capacitor C1 and the area of the opposing conductive bodies of the second capacitor C2, and there is also a match between a distance between the opposing conductive bodies of the first capacitor C1 and a distance between the opposing conductive bodies of the second capacitor C2. Therefore, the first capacitor C1 and second capacitor C2 preferably have a nearly equal capacitance.

The first electrode E1 and second electrode E2 illustrated in FIG. 2 are adjacently placed on the circuit board 2 shared by them. Therefore, their shapes and sizes are less likely to be affected by variations in manufacturing and precisely match.

The first capacitor C1 and second capacitor C2 do not necessarily have the same capacitance. It is only necessary that a certain correlation is present between their capacitances. For example, one of the two capacitors C1 and C2 may have a capacitance P times as large as the capacitance of the other by making the area of the one of the two electrodes E1 and E2 P times as large as the area of the other. That is, it is only necessary that the shapes, sizes, and positional relationships of the electrodes E1 and E2 and conductor 1 are set so that the capacitances of the two capacitors C1 and C2 have a certain correlation (such as, for example, a certain proportional relationship).

The alternating-current signal source 5 gives an alternating-current signal Vg between the first electrode E1 and a first reference potential G1. The alternating-current signal Vg generated by the alternating-current signal source 5 preferably has a higher frequency than the alternating-current voltage Vx. If the frequency of the alternating-current voltage Vx is, for example, 50 Hz, the frequency of the alternating-current signal Vg is set to about several kHz. The alternating-current signal source 5 turns on and off the output of the alternating-current signal Vg according to control of the processing unit 8.

The switch SWg, which is connected in parallel to the alternating-current signal source 5, is turned on and off according to control of the processing unit 8.

The detecting unit 6 detects charges accumulated in the second capacitor C2 by the alternating-current signal Vg from the alternating-current signal source 5, and also detects charges accumulated in the second capacitor C2 by the alternating-current voltage Vx. That is, the detecting unit 6 creates a first charge detecting signal Vs1 matching charges accumulated in the second capacitor C2 of the second electrode E2 by the alternating-current signal Vg in a state in which the second electrode E2 is kept at a certain potential (a potential equal to the first reference potential G1, for example) with respect to the first reference potential G1. The detecting unit 6 also creates a second charge detecting signal Vs2 matching charges accumulated in the second capacitor C2 of the second electrode E2 by the alternating-current voltage Vx in a state in which the second electrode E2 is kept at a certain potential (a potential equal to a second reference potential G2 used as a reference in measurement of the alternating-current voltage Vx, for example) with respect to the second reference potential G2.

In the example in FIG. 1, the detecting unit 6 has a charge detecting unit 20 and a switch SW. The switch SW, which is disposed between the first reference potential G1 and the second reference potential G2, is turned on and off according to control of the processing unit 8.

The charge detecting unit 20 maintains the second electrode E2 at a certain potential (a potential equal to the first reference potential G1, for example) with respect to the first reference potential G1, and creates a charge detecting signal Vs matching charges accumulated in the second capacitor C2. A charge detecting signal Vs in a state in which the switch SW is off is the first charge detecting signal Vs1 described above, and a charge detecting signal Vs in a state in which the switch SW is on is the second charge detecting signal Vs2 described above.

The charge detecting unit 20 includes an operational amplifier OP and a capacitor Cf as illustrated in, for example, FIG. 1. The inverting input terminal of the operational amplifier OP is connected to the second electrode E2, and the non-inverting input terminal of the operational amplifier OP is connected to the first reference potential G1. The capacitor Cf is disposed between the inverting input terminal of the operational amplifier OP and its output terminal. When the gain of the operational amplifier OP is adequately high, charges in the capacitor Cf are controlled by the output voltage (charge detecting signal Vs) of the operational amplifier OP so that the potential of the second electrode E2 becomes nearly equal to the first reference potential G1.

With the switch SW turned off, charges in the capacitor Cf are controlled so that a voltage generated in a series circuit formed by the first capacitor C1 and second capacitor C2 becomes nearly equal to the alternating-current signal Vg. Since the inverting input terminal of the operational amplifier OP is in a high impedance state and almost no current flows in it, a change in the amount of charges in the second capacitor C2 and a change in the amount of charges in the capacitor Cf become nearly equal. Therefore, a change in the amount of charges accumulated in the second capacitor C2 according to the alternating-current signal Vg and a change in the amount of charges in the capacitor Cf become nearly equal. In addition, a change in the output voltage (charge detecting signal Vs) of the operational amplifier OP is proportional to a change in the amount of charges in the capacitor Cf. Therefore, a change (alternating-current component at the same frequency as the alternating-current signal Vg) in the charge detecting signal Vs output from the operational amplifier OP is proportional to a change in the amount of charges accumulated in the capacitor Cf according to the alternating-current signal Vg.

With the switch SW turned on, the first reference potential G1 is connected to the second reference potential G2 through the switch SW and the first reference potential G1 becomes equal to the second reference potential G2. In this case, therefore, charges in the capacitor Cf are controlled so that a voltages generated in the second capacitor C2 becomes nearly equal to the alternating-current voltage Vx, so a change in the amount of charges accumulated in the second capacitor C2 according to the alternating-current voltage Vx and a change in the amount of charges in the capacitor Cf become nearly equal. Therefore, a change (alternating-current component at the same frequency as the alternating-current voltage Vx) in a charge detecting signal Vs output from the operational amplifier OP is proportional to a change in the amount of charges accumulated in the capacitor Cf according to the alternating-current voltage Vx.

The AD converting unit 7 converts the charge detecting signal Vs created in the detecting unit 6 from analog to digital.

The processing unit 8 is a circuit that controls the whole of operations of the non-contact voltage measurement device and performs calculation processing on data. The processing unit 8 is structured by including a computer that executes processing in response to instruction codes in a program stored in the storage unit 9 as well as logic circuits (such as an application-specific integrated circuit (ASIC)) implemented by specific hardware. All of processing by the processing unit 8 may be executed by a computer, or at least part may be executed by a hardware-implemented logic circuit.

The processing unit 8 has a control unit 81 and a calculating unit 82 as blocks, each of which executes predetermined processing.

The control unit 81 performs processing involved in control of the switching of the switch SW and of conversion operation by the AD converting unit 7.

The calculating unit 82 performs calculation processing on the basis of the charge detecting signal Vs that has been converted to a digital signal in the AD converting unit 7. The calculating unit 82 calculates a measurement of the alternating-current voltage Vx on the basis of the charge detecting signal Vs (first charge detecting signal Vs1) generated with the switch SW turned off and the charge detecting signal Vs (second charge detecting signal Vs2) generated with the switch SW turned on.

The storage unit 9 is a device that stores, for example, programs executed by the computer in the processing unit 8, data prepared in advance for processing, and data (such as digital values of the first charge detecting signal Vs1 and second charge detecting signal Vs2) that is temporarily stored in the course of processing. The storage unit 9 is structured by including a read-only memory (ROM), a random-access memory (RAM), a non-volatile memory, a hard disk, and the like. Programs and data stored in the storage unit 9 may be downloaded from a server (not illustrated) through a communication interface, or may be read out from a non-transitory storage medium such as an optical disk or a universal serial bus (USB) memory.

Now, the operation of the non-contact voltage measurement device illustrated in FIG. 1, which has the structure described above, will be described.

First, the processing unit 8 sets the switch SW and switch SWg to the off state, outputs the alternating-current signal Vg from the alternating-current signal source 5, and converts, in the AD converting unit 7, the charge detecting signal Vs including an alternating-current component matching the alternating-current signal Vg to a digital signal. The processing unit 8 stores, in the storage unit 9, the levels (such as the amplitude and root-mean-square value of the alternating current) of the charge detecting signal Vs that has been converted to a digital signal, as the first charge detecting signal Vs1.

If the capacitances of the first capacitor C1 and second capacitor C2 are respectively denoted C1 and C2 and the capacitance C1 is assumed to be P times the second capacitance C2, then the capacitance C0 of the series circuit formed by the first capacitor C1 and second capacitor C2 is represented by the following equation.

$$C0 = C2 \cdot P/(1+P) \tag{1}$$

The voltage of the alternating-current signal Vg will be denoted Vg. The alternating-current signal Vg is generated in the series circuit formed by the first capacitor C1 and second capacitor C2. Charges Qg (alternating-current component) accumulated in the series circuit formed by the first capacitor C1 and second capacitor C2 according to the alternating-current signal Vg is represented by the following equation.

$$Qg = Vg \cdot C0 = Vg \cdot C2 \cdot P/(1+P) \tag{2}$$

The charges Qg accumulated in the series circuit formed by the first capacitor C1 and second capacitor C2 are equal to charges accumulated in the second capacitor C2.

In the capacitor Cf, charges nearly equal to the charges Qg in the second capacitor C2 are accumulated. The voltage of the capacitor Cf is nearly equal to the output voltage (charge detecting signal Vs) of the operational amplifier OP. Therefore, the first charge detecting signal Vs1, which is a charge detecting signal Vs with the switch SW turned off, is represented by the following equation.

$$Vs1 = Qg/Cf = Vg \cdot (C2/Cf) \cdot P/(1+P) \tag{3}$$

The processing unit 8 stores, in the storage unit 9, the digital value of the first charge detecting signal Vs1 represented by equation (3).

Next, the processing unit 8 stops the output of the alternating-current signal Vg from the alternating-current signal source 5, sets the switch SW and switch SWg to the on state, and converts, in the AD converting unit 7, the charge detecting signal Vs including an alternating-current component matching the alternating-current voltage Vx to a digital signal. The processing unit 8 stores, in the storage unit 9, the levels (such as the amplitude and root-mean-square value of the alternating current) of the charge detecting signal Vs that has been converted to a digital signal, as the second charge detecting signal Vs2.

When the switch SW is turned on, the first reference potential G1 becomes equal to the second reference potential G2, so the potential of the second electrode E2 becomes nearly equal to the second reference potential G2. That is, the voltage in the second capacitor C2 becomes nearly equal to the alternating-current voltage Vx applied to the conductor 1. Charges Qx (alternating-current component) accumulated in the second capacitor C2 according to the alternating-current voltage Vx are represented by the following equation.

$$Qx=Vx \cdot C2 \quad (4)$$

In the capacitor Cf, charges nearly equal to the charges Qx in the second capacitor C2 are accumulated. The voltage of the capacitor Cf and the output voltage (charge detecting signal Vs) of the operational amplifier OP are nearly equal. Therefore, the second charge detecting signal Vs2, which is a charge detecting signal Vs with the switch SW turned on, is represented by the following equation.

$$Vs2=Qx/Cf=Vx \cdot (C2/Cf) \quad (5)$$

The processing unit 8 stores, in the storage unit 9, the digital value of the second charge detecting signal Vs2 represented by equation (5).

The calculating unit 82 calculates the alternating-current voltage Vx applied to the conductor 1, according to the digital values of the first charge detecting signal Vs1 and second charge detecting signal Vs2, the digital values being stored in the storage unit 9.

From equation (3), Cf/C2 is represented by the following equation.

$$Cf/C2=(Vg/Vs1) \cdot \{P/(P+1)\} \quad (6)$$

From equation (5), the alternating-current voltage Vx is represented by the following equation.

$$Vx=Vs2 \cdot (Cf/C2) \quad (7)$$

When equation (6) is assigned to equation (7), the alternating-current voltage Vx is represented by the following equation.

$$Vx=Vg \cdot (Vs2/Vs1) \cdot \{P/(P+1)\} \quad (8)$$

Therefore, the calculating unit 82 can calculate a measurement of the alternating-current voltage Vx from equation (8), according to the digital values of the first charge detecting signal Vs1 and second charge detecting signal Vs2, the digital values being stored in the storage unit 9, and to the known values of Vg and P.

As described above, with the non-contact voltage measurement device according to this embodiment, the first capacitor C1 and second capacitor C2 that have mutually correlated capacitances are respectively formed between the first electrode E1 and the conductor 1 and between the second electrode E2 and the conductor 1, and the alternating-current signal Vg is given between the first electrode E1 and the first reference potential G1. With the switch SW turned off, the first charge detecting signal Vs1 matching charges Qg accumulated in the second capacitor C2 by the alternating-current signal Vg is created in a state in which the second electrode E2 is kept at a potential equal to the first reference potential G1. With the switch SW turned on, the second charge detecting signal Vs2 matching charges Qx accumulated in the second capacitor C2 by the alternating-current voltage Vx is created in a state in which the second electrode E2 is kept at a potential equal to the second reference potential G2. A measurement of the alternating-current voltage Vx is calculated in the calculating unit 82, according to the first charge detecting signal Vs1 created with the switch SW turned off and to the second charge detecting signal Vs2 created with the switch SW turned on.

Accordingly, unlike the conventional device, a measurement of the alternating-current voltage Vx can be obtained without having to provide a filter used to discriminate between a component having the frequency of the alternating-current voltage Vx, which is a target to be measured, and a component having the frequency of the alternating-current signal Vg used to measure stray capacitances C1 and C2. Therefore, the structure can be simplified when compared with the conventional device.

With the non-contact voltage measurement device according to this embodiment, unlike the conventional device, there is no need to remove the electrodes E1 and E2 from the conductor 1 before measuring stray capacitances, so the measurement procedure can be simplified. There is also no measurement error, which would otherwise be caused when the electrodes E1 and E2 are removed and then attached again, higher measurement precision can be obtained when compared with the conventional device.

With the non-contact voltage measurement device according to this embodiment, the two capacitors C1 and C2 of parallel plate type are formed by disposing the electrode-side flat parts FP2 provided as part of the two electrodes E1 and E2 so as to face the conductor-side flat part FP1 provided as part of the conductor 1 to each other in parallel and at the equal distance from the conductor-side flat part FP1.

Accordingly, since the ratio of the capacitances of the two capacitors C1 and C2 becomes nearly equal to the ratio of the areas of the electrode-side flat parts FP2 of the two electrodes E1 and E2, it becomes possible to set the ratio of capacitances with high precision. In particular, by making the electrode-side flat parts FP2 of the two electrodes E1 and E2 congruent to each other, the areas of the two electrodes E1 and E2 can be matched with high precision, so the capacitances of the two capacitors C1 and C2 can be matched with high precision. Therefore, precision in measurement of the alternating-current voltage Vx can be further improved.

With the non-contact voltage measurement device according to this embodiment, the alternating-current signal Vg has a higher frequency than the alternating-current voltage Vx. With the switch SW turned off, therefore, the charges Qg accumulated in the second capacitor C2 by the alternating-current signal Vg can be made adequately larger than charges Qerr accumulated in the second capacitor C2 by the alternating-current voltage Vx.

That is, since parasitic capacitance is slightly present between the first reference potential G1 and the second reference potential G2, even if the switch SW is off, charges Qerr accumulated in the second capacitor C2 by the alternating-current voltage Vx are slightly present. By making the frequency of the alternating-current signal Vg adequately higher than the frequency of the alternating-current voltage Vx, current flowing in the second capacitor C2 is increased and the charges Qg become larger than the charges Qerr, so measurement error due to the charges Qerr can be reduced.

Furthermore, with the non-contact voltage measurement device according to this embodiment, the output of the alternating-current signal Vg from the alternating-current signal source 5 is stopped in a state in which the switch SW is on. When the second charge detecting signal Vs2 is to be created, therefore, error due to inclusion of a component having the frequency of the alternating-current signal Vg can be prevented and a drop in measurement precision can be suppressed.

As illustrated in FIG. 1, loads 3A and 3B are present in the power supply lines of the commercial electric power system 4, so the conductor 1 has impedance with respect to the second reference potential G2. If the output of the alternating-current signal Vg is continuing with the switch SW turned on, the potential of the conductor 1 slightly fluctuates due to the effect of the alternating-current signal Vg. This causes error in measurement of the alternating-current voltage Vx. By stopping the output of the alternating-current signal Vg, the fluctuation of the potential of the conductor 1 due to the alternating-current signal Vg does not occur, so error in measurement of the alternating-current voltage Vx can be suppressed.

Second Embodiment

Next, a second embodiment of the present invention will be described. With the non-contact voltage measurement device in the first embodiment described above, by providing the switch SW between the first reference potential G1 and the second reference potential G2, the first charge detecting signal Vs1 and second charge detecting signal Vs2 are created by the charge detecting unit 20 shared by them. In contrast, with a non-contact voltage measurement device according to this embodiment, the first charge detecting signal Vs1 and second charge detecting signal Vs2 are created by independent charge detecting units.

Figure 3:
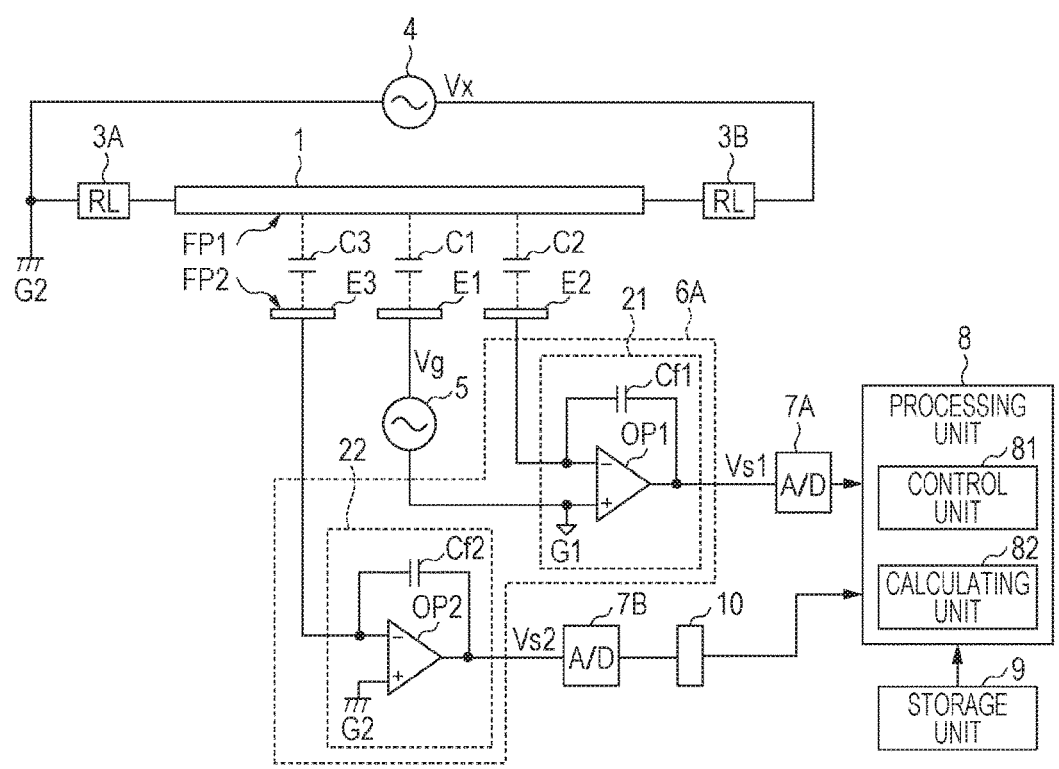
FIG. 3 illustrates an example of the structure of a non-contact voltage measurement device according to a second embodiment.
Figure 4:
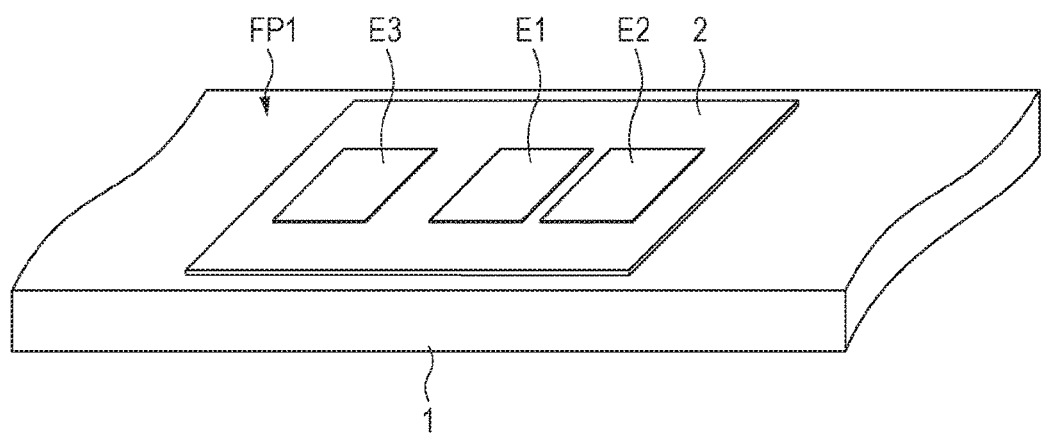
FIG. 4 illustrates examples of electrodes in the non-contact voltage measurement device illustrated in FIG. 3.

FIG. 3 illustrates an example of the structure of the non-contact voltage measurement device according to the second embodiment. FIG. 4 illustrates examples of electrodes in the non-contact voltage measurement device illustrated in FIG. 3.

As illustrated in, for example, FIG. 3, the non-contact voltage measurement device according to this embodiment has a first electrode E1, a second electrode E2, a third electrode E3, an alternating-current signal source 5, a detecting unit 6A, (analog-to-digital) AD converting units 7A and 7B, a processing unit 8, a storage unit 9, and a photocoupler 10. Of these, the first electrode E1, second electrode E2, alternating-current signal source 5, processing unit 8, and storage unit 9 are the same as the constituent elements in FIG. 1 that have like reference numerals.

The third electrode E3 forms a third capacitor C3 between the third electrode E3 and the conductor 1. The third electrode E3 has a structure similar to the structures of the first electrode E1 and second electrode E2 already described. In the example in FIG. 3, the three electrodes E1 to E3 are conductive patterns formed on the circuit board 2 shared by them, and each of them has the electrode-side flat part FP2 parallel to the conductor-side flat part FP1. The electrode-side flat parts FP2 of the three electrodes E1 to E3 oppose the conductor-side flat part FP1 of the conductor 1 in parallel, and are equally distant from the conductor-side flat part FP1. Since, in the example in FIG. 3, the electrode-side flat parts FP2 of the three electrodes E1 to E3 each have a mutually congruent shape, the three capacitors C1 to C3 formed by these electrodes each have a nearly equal capacitance.

The three capacitors C1 to C3 are not necessarily identical. It is only necessary that a certain correlation (such as, for example, a certain proportional relationship) is present between them.

As with the detecting unit 6 described earlier, the detecting unit 6A detects charges accumulated in the second capacitor C2 by the alternating-current signal Vg from the alternating-current signal source 5, and also detects charges accumulated in the second capacitor C2 by the alternating-current voltage Vx. That is, the detecting unit 6A creates the first charge detecting signal Vs1 matching charges accumulated in the second capacitor C2 of the second electrode E2 by the alternating-current signal Vg and, also creates the second charge detecting signal Vs2 matching charges accumulated in the second capacitor C2 of the second electrode E2 by the alternating-current voltage Vx. However, although the detecting unit 6 in the previous embodiment has created a different charge detecting signal Vs (Vs1 or Vs2) depending on the state of the switch SW, the detecting unit 6A in this embodiment independently creates the first charge detecting signal Vs1 and second charge detecting signal Vs2.

The detecting unit 6A has a first charge detecting unit 21 and a second charge detecting unit 22 as illustrated in, for example, FIG. 3.

The first charge detecting unit 21 maintains the second electrode E2 at a certain potential (a potential equal to the first reference potential G1, for example) with respect to the first reference potential G1, and creates the first charge detecting signal Vs1 matching charges accumulated in the second capacitor C2. In the example in FIG. 3, the first charge detecting unit 21 includes an operational amplifier OP1 and a capacitor Cf1. These operational amplifier OP1 and capacitor Cf1 are the same as the operational amplifier OP and capacitor Cf in FIG. 1, and thereby operate similarly to them. Therefore, the first charge detecting signal Vs1 created by the first charge detecting unit 21 is the same as the charge detecting signal Vs created by the charge detecting unit 20 with the switch SW turned off in the previous embodiment.

The second charge detecting unit 22 maintains the third electrode E3 at a certain potential (a potential equal to the second reference potential G2, for example) with respect to the second reference potential G2, and creates the second charge detecting signal Vs2 matching charges accumulated in the third capacitor C3. In the example in FIG. 3, the second charge detecting unit 22 includes an operational amplifier OP2 and a capacitor Cf2. The inverting input terminal of the operational amplifier OP2 is connected to the third electrode E3, and the non-inverting input terminal of the operational amplifier OP2 is connected to the second reference potential G2. The capacitor Cf2 is disposed between the inverting input terminal of the operational amplifier OP2 and its output terminal.

When the gain of the operational amplifier OP2 is adequately high, charges in the capacitor Cf2 are controlled by the output voltage (second charge detecting signal Vs2) of the operational amplifier OP2 so that the potential of the third electrode E3 becomes nearly equal to the second reference potential G2. That is, charges in the capacitor Cf2 are controlled so that a voltage generated in the third capacitor C3 becomes nearly equal to the alternating-current voltage Vx.

The inverting input terminal of the operational amplifier OP2 is in a high impedance state and almost no current flows in it, so a change in the amount of charges in the third capacitor C3 and a change in the amount of charges in the capacitor Cf2 become nearly equal. Therefore, a change in the amount of charges, in the third capacitor C3, according to the alternating-current voltage Vx and a change in the amount of charges in the capacitor Cf2 become nearly equal. In addition, a change in the output voltage (second charge detecting signal Vs2) of the operational amplifier OP2 is proportional to a change in the amount of charges in the capacitor Cf2. Therefore, a change (alternating-current component at the same frequency as the alternating-current voltage Vx) in the second charge detecting signal Vs2 output from the operational amplifier OP2 is proportional to a change in the amount of charges, in the capacitor Cf2, according to the alternating-current voltage Vx. This second charge detecting signal Vs2 is the same as the charge detecting signal Vs generated by the charge detecting unit 20 with the switch SW turned on in the previous embodiment.

The AD converting unit 7A converts the first charge detecting signal Vs1 created in the detecting unit 6A from analog signal to digital, and enters the converted signal into the processing unit 8.

The AD converting unit 7B converts the second charge detecting signal Vs2 created in the detecting unit 6A from analog to digital, and enters the converted signal into the processing unit 8.

The photocoupler 10 is provided in a path through which the digital signal is transmitted from the AD converting unit 7B to the processing unit 8. By converting an electric signal to an optical signal and then restoring the optical signal to the electric signal, the photocoupler 10 transmits the digital signal from the AD converting unit 7B to the processing unit 8 while maintaining electrical insulation between the AD converting unit 7B and the processing unit 8.

With the structure described above, the first charge detecting signal Vs1 and second charge detecting signal Vs2, which are similar to those in the detecting unit 6 in FIG. 1, are created in the detecting unit 6A, and a measurement of the alternating-current voltage Vx is calculated in the calculating unit 82, according to the first charge detecting signal Vs1 and second charge detecting signal Vs2. Therefore, the alternating-current voltage Vx can be precisely measured with a simple structure as with the non-contact voltage measurement device, illustrated in FIG. 1, which has been described earlier.

With the non-contact voltage measurement device according to this embodiment, since the switch SW is not provided between the first reference potential G1 and the second reference potential G2, a parasitic capacitance between the first reference potential G1 and the second reference potential G2 can be made very small. Accordingly, the first charge detecting signal Vs1 created in the first charge detecting unit 21 is less likely to cause error due to the alternating-current voltage Vx, so precision in measurement of the alternating-current voltage Vx can be improved.

The present invention is not limited to the embodiments described above. That is, a person having ordinary skill in the art may make various modifications, combinations, sub-combinations, and replacements for the constituent elements in the embodiments described above, within the technical range of the present invention or an equivalent range of the technical range.

Since the charge detecting units 20, 21, and 22 in the embodiments described above detect a small change in the capacitors C1 to C3, the charge detecting units 20, 21, and 22 are susceptible to external noise. Therefore, guard rings formed from a conductor may be provided around the electrodes E1 to E3, which form the capacitors C1 to C3, to reduce the effect of external noise.

Figure 5A:
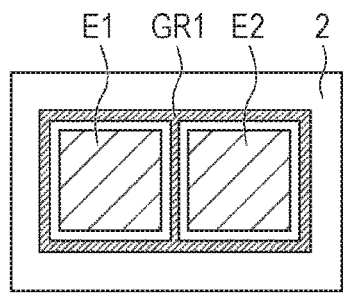
FIGS. 5A and 5B illustrate examples of guard rings provided around electrodes.
Figure 5B:
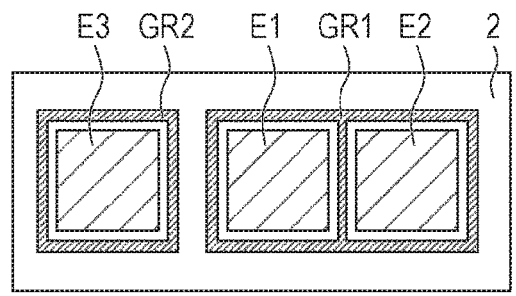

FIGS. 5A and 5B illustrate examples of guard rings provided around the electrodes E1 to E3. Specifically, FIG. 5A illustrates a guard ring GR1 provided around the first electrode E1 and second electrode E2 illustrated in FIG. 2, and FIG. 5B illustrates a guard ring GR2 provided around the third electrode E3 illustrated in FIG. 4 besides the guard ring GR1 provided around the first electrode E1 and second electrode E2 also illustrated in FIG. 4. Since the potentials of the first electrode E1 and second electrode E2 and the potential of the third electrode E3 differ, the guard ring GR2 around the third electrode E3 is provided separately from the guard ring GR1 around the first electrode E1 and second electrode E2, as illustrated in FIG. 5B. Any one of the guard rings GR1 and GR2 may be appropriately omitted according to the situation of external noise. In addition, the guard ring GR1 may enclose only any one of the first electrode E1 and second electrode E2.

Although, in the embodiments described above, examples have been taken in which an electrode E1, E2, or E3 and the conductor 1 to which a voltage to be measured is applied form a capacitor of parallel plate type, the present invention is not limited to this. The shapes, sizes, and placements, and the like of the conductor and electrodes may be arbitrary. For example, the conductor to which an alternating-current voltage to be measured is applied may be a columnar conductor or rod-like conductor that has a circular cross section. In this case, it suffices to bend the circuit board 2 and electrodes E1 to E3 in a cylindrical shape along the surface of the conductor 1 and place them. For example, a flexible printed circuit board bent in a cylindrical shape so as to enclose the surface of a columnar conductor may be provided, and conductive patterns used as the electrodes in the present invention may be formed on the flexible printed circuit board.

Although, in the embodiments described above, the charge detecting signals Vs, Vs1, and Vs2, which are respectively output from the charge detecting units 20, 21, and 22, are converted to digital values and then a measurement of the alternating-current voltage Vx is calculated, the present invention is not limited to this. In another embodiment of the present invention, a measurement result of the alternating-current voltage Vx may be created as an analog signal by performing analog calculation processing on a charge detecting signal output from a charge detecting unit.

In the first embodiment (see FIG. 1) described above, the switch SW is first set to the off state and the first charge detecting signal Vs1 is created, after which the switch SW is set to the on state and the second charge detecting signal Vs2 is created. In another embodiment of the present invention, however, the second charge detecting signal Vs2 may be first created, after which the first charge detecting signal Vs1 may be created.

In the first embodiment (see FIG. 1) described above, the processing unit 8 performs on/off control for the switch SW. In another embodiment of the present invention, however, on/off control for the switch SW may be performed in response to a command transmitted from another host device or to a user's instruction entered through a user interface device.

What is claimed is:

1. A non-contact voltage measurement device that measures an alternating voltage applied to a conductor, without electrical direct contact with the conductor, the device comprising:
    a first electrode that forms a first capacitor with the conductor, the first capacitor having a first capacitance;
    a second electrode that forms a second capacitor with the conductor, the second capacitor having a second capacitance correlating with the first capacitance;
    a signal source that provides an alternating-current signal between the first electrode and a first potential;
    a charge detecting unit that maintains the second electrode at a certain potential with respect to a reference potential, thereby generating a charge detecting signal corresponding to a charge accumulated in the second capacitor;
    a switch provided between the first potential and a second potential, the reference potential being set at the first potential when the switch is turned off, and being set at the second potential when the switch is turned on to measure the alternating voltage; and a calculating unit that calculates a value of the alternating voltage based on a first charge detecting signal obtained when the switch is turned off and a second charge detecting signal obtained when the switch is turned on.

2. The non-contact voltage measurement device according to claim 1, wherein the signal source generates the alternating-current signal having a frequency higher than a frequency of the alternating voltage.

3. The non-contact voltage measurement device according to claim 1, wherein:

the conductor has a conductor flat surface facing the first electrode and the second electrode; and the first electrode has a first flat surface parallel to and facing the conductor flat surface, and the second electrode has a second flat surface parallel to and facing the conductor flat surface, the first and second flat surfaces being equally distant from the conductor flat surface.

4. The non-contact voltage measurement device according to claim 3, wherein the first and second flat surfaces have a same shape and a same area such that the first capacitor and the second capacitor have a same capacitance.

5. The non-contact voltage measurement device according to claim 3, wherein the first electrode and the second electrode are arranged adjacent to each other.

6. The non-contact voltage measurement device according to claim 1, further comprising a guard ring that encloses at least one of the first electrode and the second electrode.

7. A non-contact voltage measurement device that measures an alternating voltage applied to a conductor, without electrical direct contact with the conductor, the device comprising:

a first electrode that forms a first capacitor with the conductor, the first capacitor having a first capacitance;

a second electrode that forms a second capacitor with the conductor, the second capacitor having a second capacitance correlating with the first capacitance;

a third electrode that forms a third capacitor with the conductor, the third capacitor having a third capacitance correlating with the first capacitance;

a signal source that provides an alternating-current signal between the first electrode and a first reference potential;

a first charge detecting unit that maintains the second electrode at a certain potential with respect to the first reference potential, thereby generating a first charge detecting signal corresponding to a charge accumulated in the second capacitor;

a second charge detecting unit that maintains the third electrode at a certain potential with respect to a second reference potential for measuring the alternating voltage, thereby generating a second charge detecting signal corresponding to a charge accumulated in the third capacitor; and a calculating unit that calculates a value measurement of the alternating voltage based on the first charge detecting signal and the second charge detecting signal.

8. The non-contact voltage measurement device according to claim 7, wherein the signal source generates the alternating-current signal having a frequency higher than a frequency of the alternating voltage.

9. The non-contact voltage measurement device according to claim 7, wherein:

the conductor has a conductor flat surface facing the first electrode, the second electrode, and the third electrode; and the first electrode has a first flat surface parallel to and facing the conductor flat surface, the second electrode has a second flat surface parallel to and facing the conductor flat surface, and the third electrode has a third flat surface parallel to and facing the conductor flat surface, the first, second, and third flat surfaces being equally distant from the conductor flat surface.

10. The non-contact voltage measurement device according to claim 9 wherein the first, second, and third flat surfaces have a same shape and a same area such that the first capacitor, the second capacitor, and the third capacitor have a same capacitance.

11. The non-contact voltage measurement device according to claim 9, wherein the first electrode and the second electrode are arranged adjacent to each other.

12. The non-contact voltage measurement device according to claim 7, further comprising at least one of:

a first guard ring that encloses at least one of the first electrode and the second electrode; and a second guard ring that encloses the third electrode.

13. A non-contact voltage measurement device that measures an alternating voltage applied to a conductor, without electrical direct contact with the conductor, the device comprising:

a plurality of electrodes that form respective capacitors with the conductor, the plurality of capacitors having mutually correlated capacitances;

a signal source that provides an alternating-current signal between a first reference potential and a first electrode among the plurality of electrodes;

a detecting unit that generates a first charge detecting signal corresponding to a charge accumulated in the capacitor formed by a second electrode among the plurality of electrodes by applying the alternating-current signal while maintaining the second electrode at a certain potential with respect to the first reference potential, and also generates a second charge detecting signal corresponding to a charge accumulated in the capacitor formed by a third electrode among the plurality of electrodes by applying the alternating-current voltage while maintaining the third electrode at a certain potential with respect to a second reference potential for measuring the alternating voltage; and a calculating unit that calculates a value of the alternating voltage based on the first charge detecting signal and the second charge detecting signal.

14. The non-contact voltage measurement device according to claim 1, further comprising a second switch that selectively connects the first electrode to the signal source and to the second reference potential.

* * * * *